(12) United States Patent
Wilson et al.

(10) Patent No.: US 8,976,898 B1
(45) Date of Patent: Mar. 10, 2015

(54) LOW-DISTORTION CLASS S POWER AMPLIFIER WITH CONSTANT-IMPEDANCE BANDPASS FILTER

(71) Applicant: LSI Corporation, San Jose, CA (US)

(72) Inventors: Ross S. Wilson, Menlo Park, CA (US); James F. MacDonald, Mendota Heights, MN (US); Peter Kiss, Basking Ridge, NJ (US); Donald R. Laturell, Oak Hill, FL (US); Said E. Abdelli, Minneapolis, MN (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 14/086,811

(22) Filed: Nov. 21, 2013

Related U.S. Application Data

(60) Provisional application No. 61/904,320, filed on Nov. 14, 2013.

(51) Int. Cl.
*H04K 1/02* (2006.01)
*H04L 25/03* (2006.01)
*H04L 25/49* (2006.01)

(52) U.S. Cl.
CPC ............................... *H04L 25/03343* (2013.01)
USPC ............................ 375/297; 375/295; 375/296

(58) Field of Classification Search
USPC ......................................................... 375/297
See application file for complete search history.

(56) References Cited

U.S. PATENT DOCUMENTS

| | | |
|---|---|---|
| 3,323,070 A | 5/1967 | Hayes |
| 4,381,487 A | 4/1983 | Erickson |
| 6,608,536 B2 * | 8/2003 | Fallahi ........................ 333/168 |
| 6,624,700 B2 | 9/2003 | Luo et al. |
| 6,949,988 B2 | 9/2005 | Fallahi |
| 6,993,087 B2 | 1/2006 | Rosnell et al. |
| 7,412,007 B1 * | 8/2008 | Richley et al. ............... 375/296 |
| 7,948,312 B2 | 5/2011 | Cao |
| 7,978,009 B2 | 7/2011 | Mu |
| 8,013,771 B2 | 9/2011 | Booth et al. |
| 8,254,854 B2 | 8/2012 | Wang et al. |

(Continued)

OTHER PUBLICATIONS

A. Wentzel, et al., "A Voltage-Mode Class-S Power Amplifier for the 450 MHz Band," Int. J. Microwave and Wireless Techn., vol. 3, No. 3, pp. 311-318, Feb. 2011.

M. Berroth, et al., "A 1.6 GHz Switch Mode Power Amplifier with Continuous-Time Bandpass Delta-Sigma Modulator," IEEE Int. Midwest Symp. Circ. Syst. MWSCAS, pp. 1051-1054, Aug. 2009.

(Continued)

*Primary Examiner* — Erin File
(74) *Attorney, Agent, or Firm* — Hamilton DeSanctis & Cha

(57) ABSTRACT

An amplification system and an integrated circuit include a bandpass filter and an amplifier. The bandpass filter filters an input digital bitstream or an amplified signal to provide a filtered signal. The bandpass filter exhibits constant input impedance over a passband associated with the input digital bitstream, and a stopband associated with shaped-noise energy, thereby increasing signal-to-noise ratio and/or signal-to-distortion ratio associated with the filtered signal. The amplifier amplifies at least one of the filtered signal and the input digital bitstream to provide the amplified signal. A method of providing amplification includes bandpass filtering an input digital bitstream or an amplified signal to provide a filtered signal, providing constant input impedance over a passband and a stopband by the bandpass filtering, and amplifying at least one of the filtered signal and the input digital bitstream to provide the amplified signal.

17 Claims, 22 Drawing Sheets

(56) References Cited

U.S. PATENT DOCUMENTS

| | | | |
|---|---|---|---|
| 2004/0042622 A1* | 3/2004 | Saito | 381/74 |
| 2006/0223450 A1* | 10/2006 | Dacosta | 455/73 |
| 2008/0191678 A1* | 8/2008 | Feldtkeller et al. | 323/282 |
| 2011/0103508 A1 | 5/2011 | Mu et al. | |
| 2014/0266843 A1* | 9/2014 | Pagnanelli | 341/155 |

OTHER PUBLICATIONS

E. Serebryakova, K. Blau, and M. Hein, "Miniaturisation of Combline Filters for Switched-Mode Power Amplifier Systems," Adv. Radio Sci., 6, pp. 125-127, 2008.

E. Serebryakova, et al., "High-Power Filters for Switched-Mode Power Amplifier Systems," IEEE Radio and Wireless Symp., pp. 276-279, Jan. 2009.

\* cited by examiner $$\Gamma_{IN} = S_{11} = \frac{Z_{IN} - R_{NORM}}{Z_{IN} + R_{NORM}} \longrightarrow 0 \text{ as mismatch} \longrightarrow 0$$

$$R_{NORM} \equiv 20$$

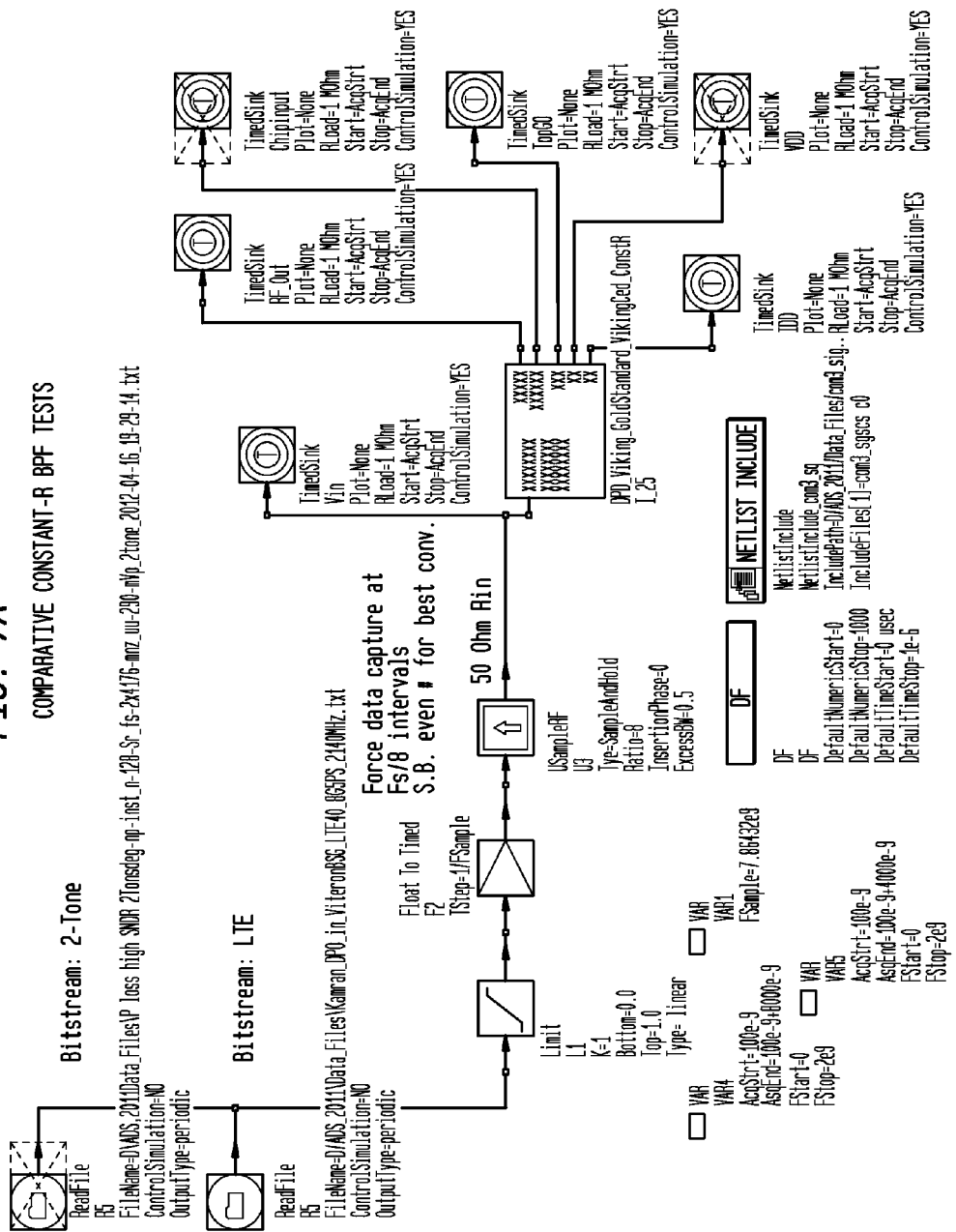
FIG. 7A  COMPARATIVE CONSTANT-R BPF TESTS

RF OUTPUT SPECTRUM: MAGNIFIED

RF OUTPUT SPECTRUM

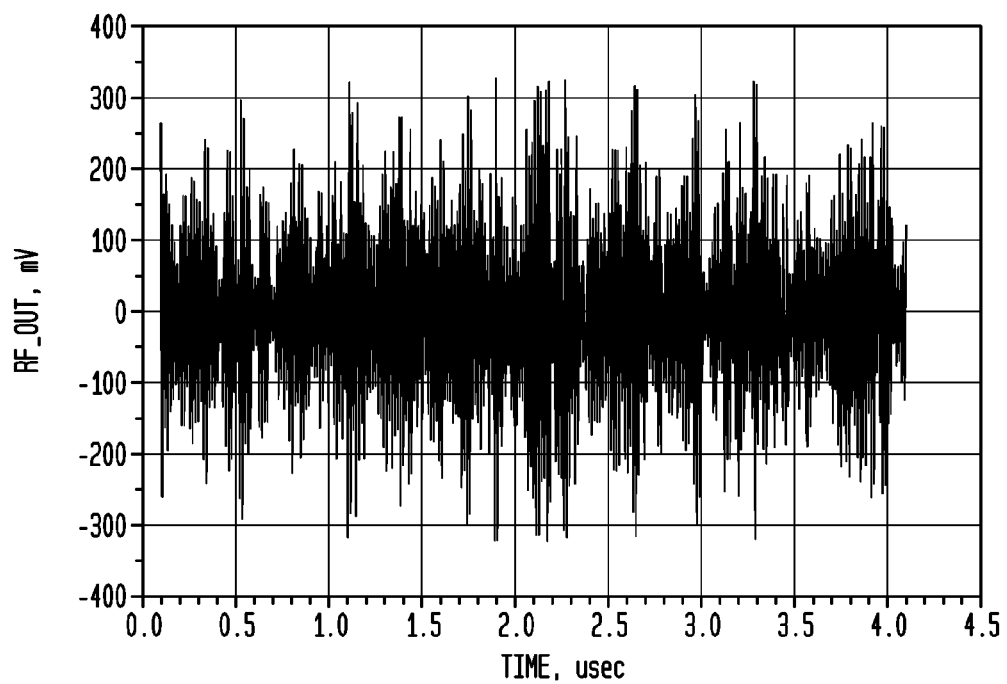

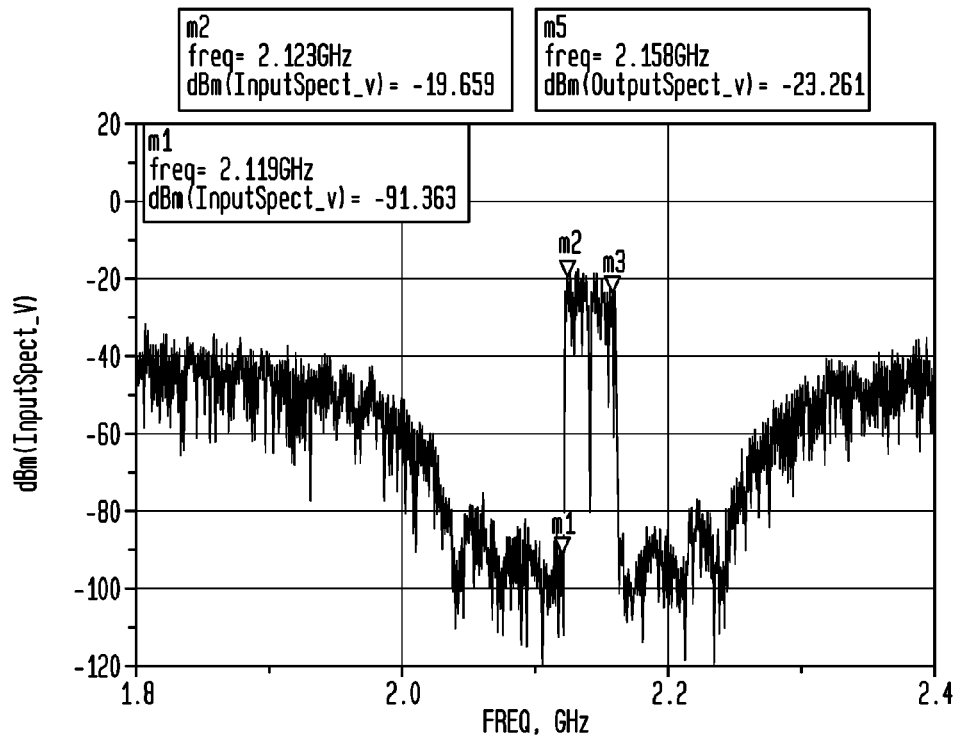
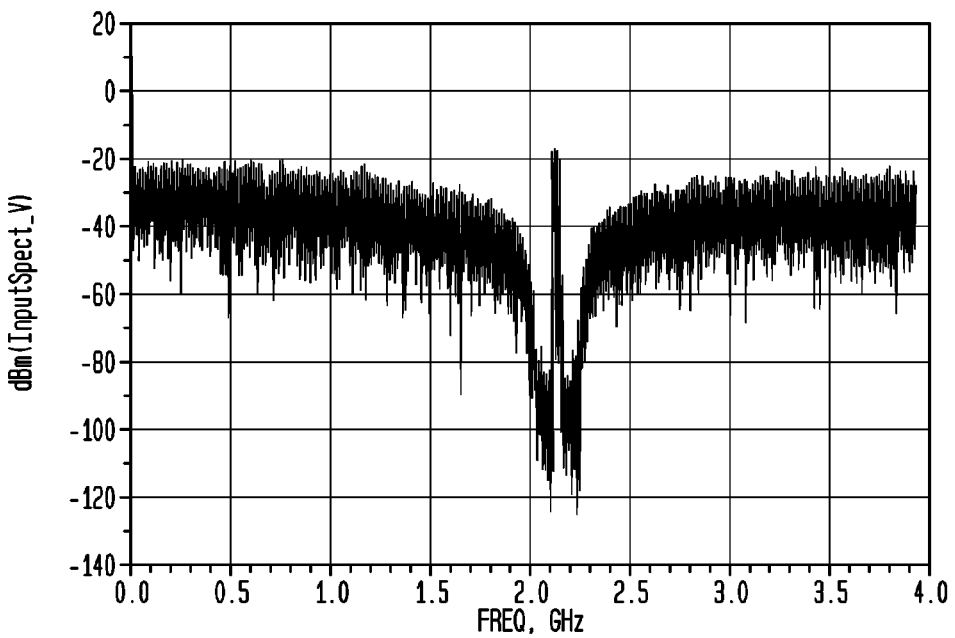

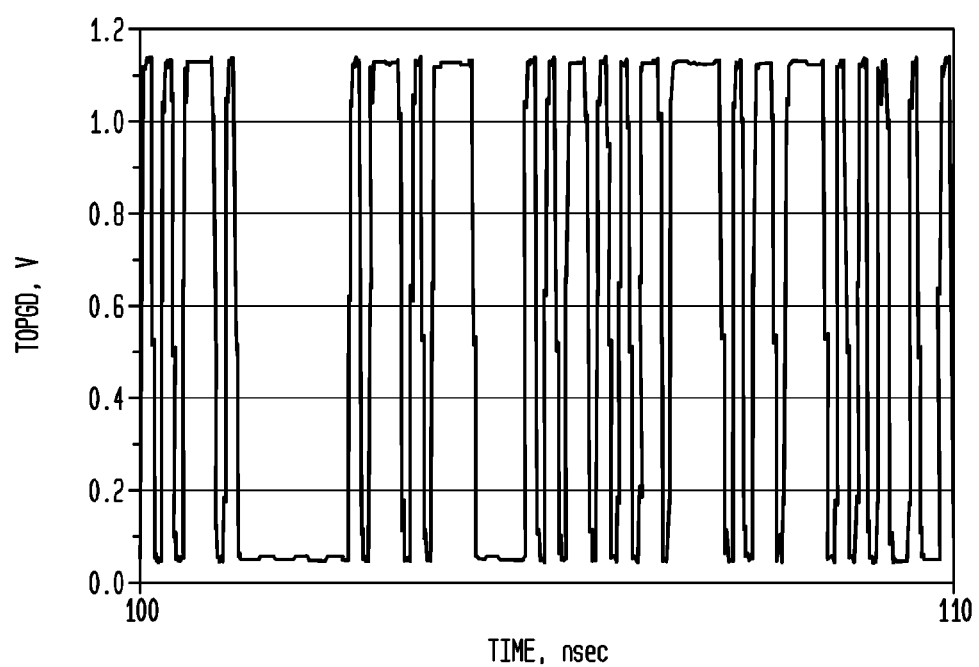

RF OUTPUT SPECTRUM: MAGNIFIED

RF OUTPUT SPECTRUM

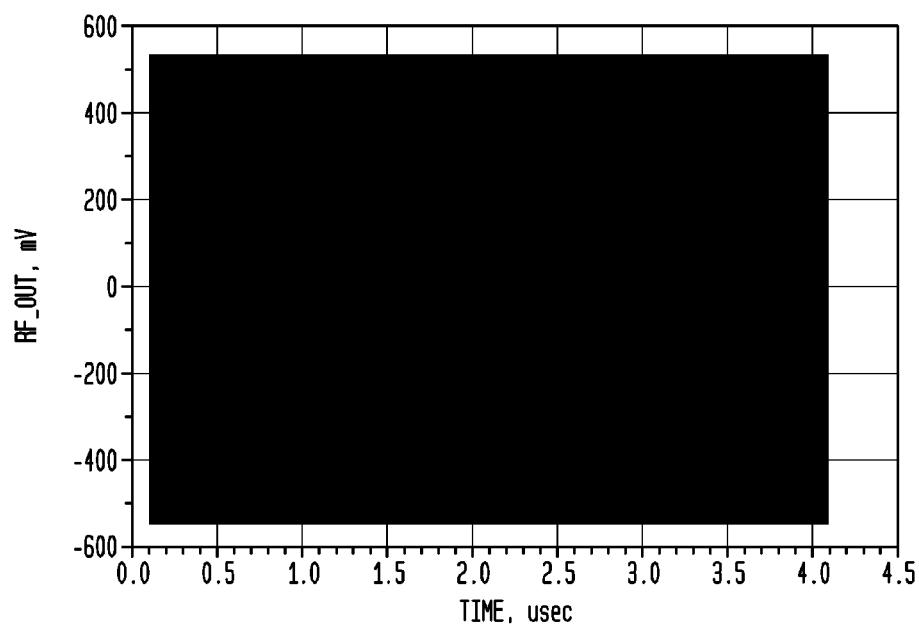

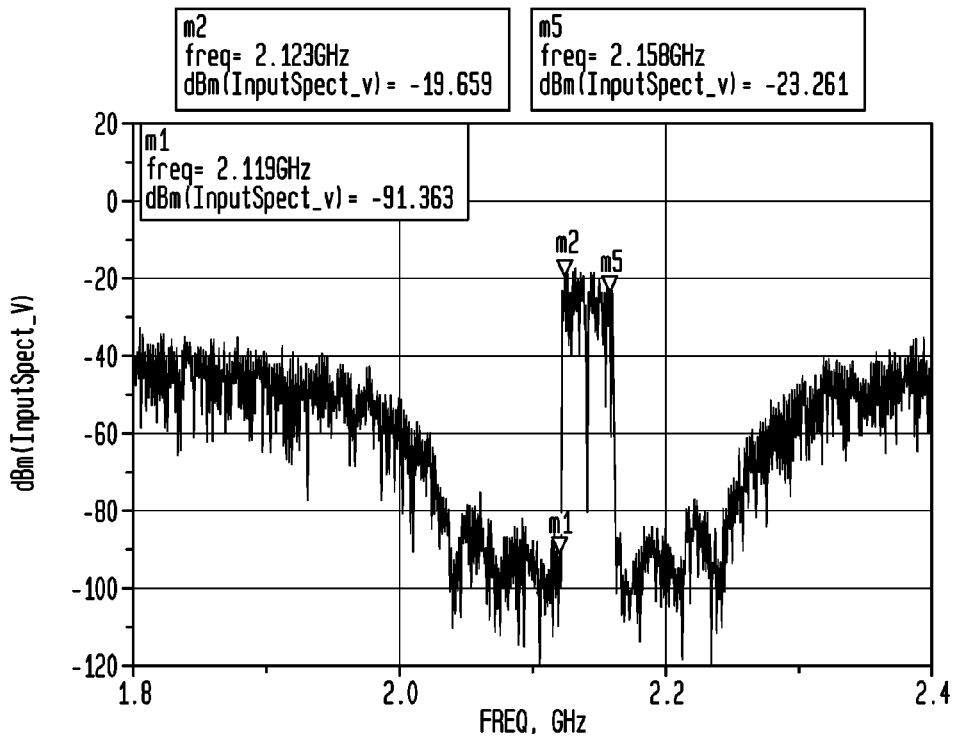
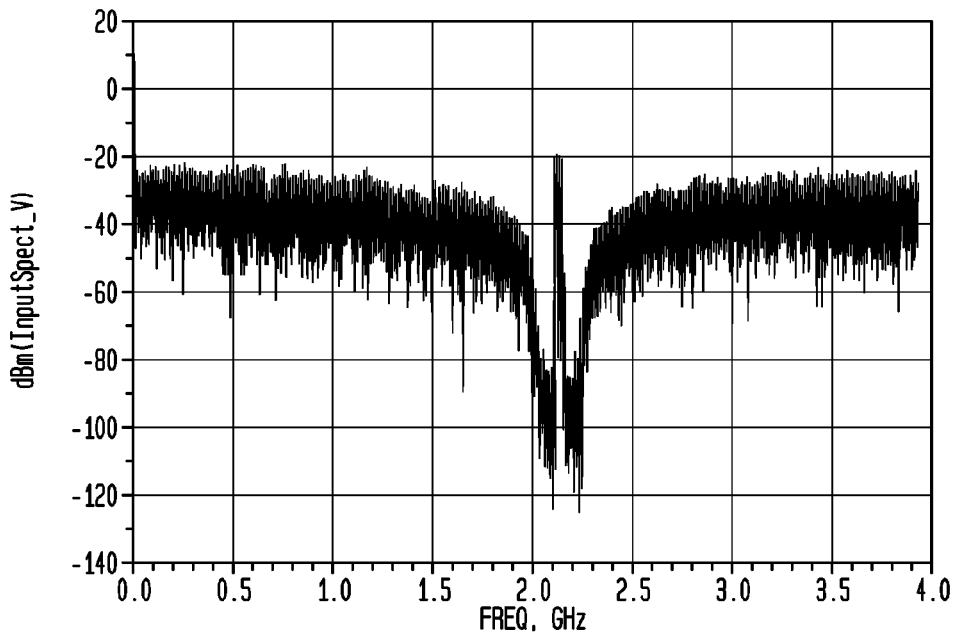

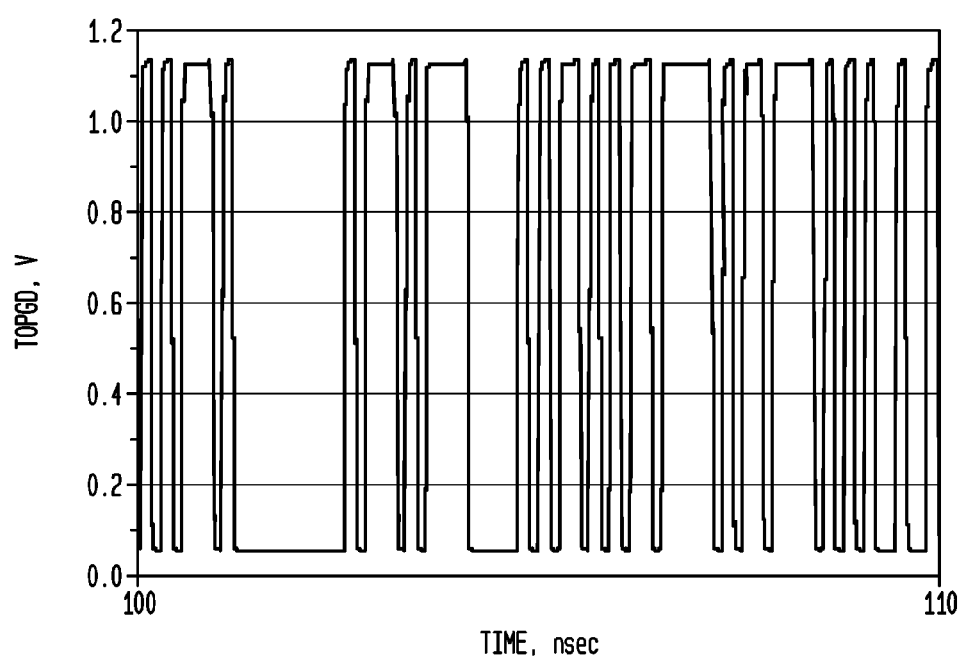

RF OUTPUT SPECTRUM: MAGNIFIED

RF OUTPUT SPECTRUM

RF OUT TIME DOMAIN

OUTPUT RF POWER

| Pout_dBmW | Pout_W |
|---|---|
| -7.646 | 1.719E-4 |

FIG. 10D
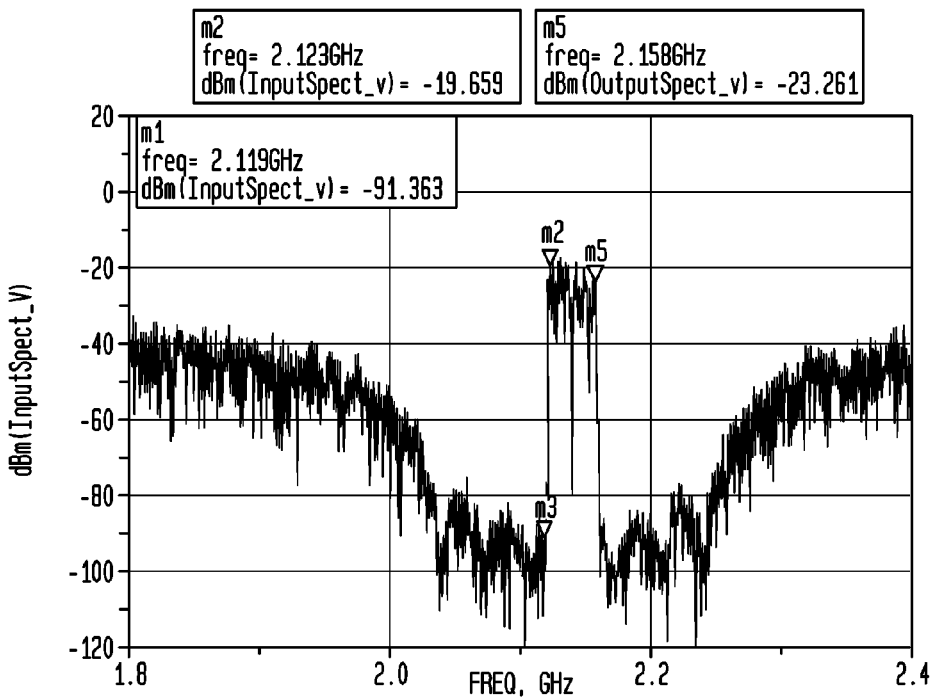
FIG. 10E
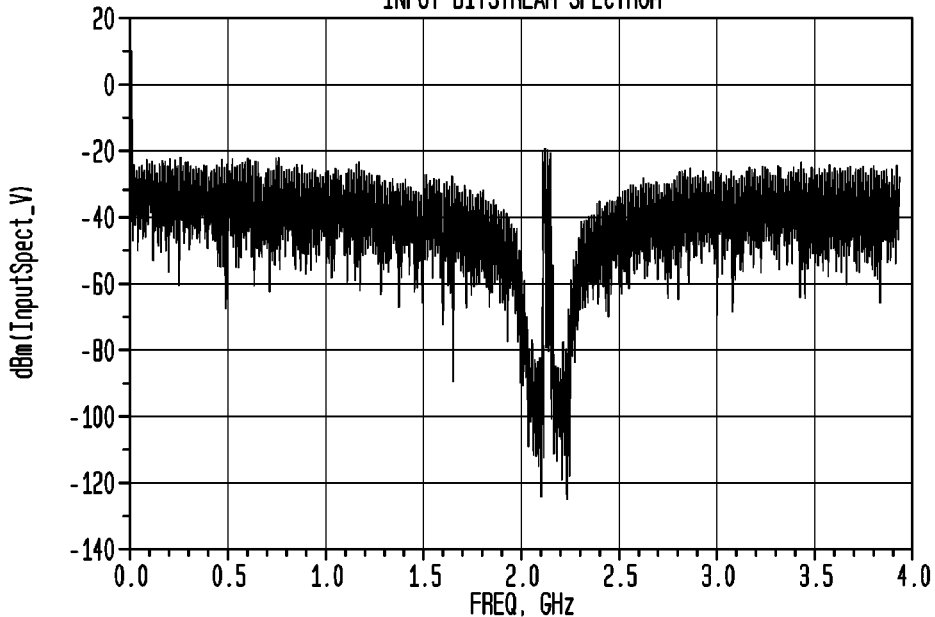
FIG. 10F
| INPUT RF POWER | |
|---|---|
| Pin_dBmW | Pin_W |
| -6.639 | 2.168E-4 |

FIG. 11

| LOAD | OUTPUT SFDR | OUTPUT SNDR | INPUT SFDR | INPUT SNDR |
|---|---|---|---|---|
| IDEAL R | 71.2 dB | 54.2 dB | 82.7 dB | 64.8 dB |
| DOUBLE-TERMINATED BPF (HIGH OUTBAND Γ) | 63.7 dB | 46.7 dB | " | " |
| CONSTANT INPUT IMPEDANCE BPF | 72.6 dB | 54.9 dB | " | " |

LOW-DISTORTION CLASS S POWER AMPLIFIER WITH CONSTANT-IMPEDANCE BANDPASS FILTER

CROSS-REFERENCE TO RELATED APPLICATION(S)

This application claims priority to U.S. Provisional Application No. 61/904,320, filed Nov. 14, 2013, which is incorporated by reference herein in its entirety.

TECHNICAL FIELD

The present invention relates generally to electrical and electronic circuitry, and more particularly relates to power amplifiers.

BACKGROUND

Class S radio frequency power amplifiers (RFPAs) use single-bit sequences to synthesize radio frequency (RF) signals. As Class S technology moves the digital-to-analog boundary towards the power amplifier output stage, an increase in integration relative to analog RF signal processing techniques is made possible.

Class S power amplifiers typically refer to those amplifiers that filter an applied bitstream, which encodes a desired modulated RF signal, to deliver the bitstream in high-power analog form. Bitstream generators used in Class S-based RF transmitters upshift baseband information to a desired carrier frequency while shaping single-bit quantization noise power away from a carrier frequency, $F_{CARRIER}$. In Class S power amplifiers associated with a 2.14 gigahertz (GHz) cellular band, for example, the output stage of the amplifier is switched at a rate in excess of eight (8) billion transitions per second.

SUMMARY

In accordance with an embodiment of the invention, an amplification system includes a bandpass filter and an amplifier. The bandpass filter filters at least one of an input digital bitstream and an amplified signal to provide a filtered signal. The bandpass filter exhibits constant input impedance over a passband associated with the input digital bitstream, and constant input impedance over a stopband associated with shaped-noise energy, thereby increasing signal-to-noise ratio and/or signal-to-distortion ratio associated with the filtered signal. The amplifier amplifies the filtered signal and/or the input digital bitstream to provide the amplified signal. Other embodiments of the invention include, but are not limited to, being manifest as a method of providing amplification and an integrated circuit. Additional and/or other embodiments of the invention are described in the following written description, including the claims, which is to be read in connection with the accompanying drawings.

BRIEF DESCRIPTION OF THE DRAWINGS

The following drawings are presented by way of example only and without limitation, wherein like reference numerals indicate corresponding elements throughout the several views, and wherein:

FIGS. 7A-B show bench test simulation schematics;

FIGS. 8A-F show plots of performance data associated with a constant-impedance bandpass filter for use with the LTE bitstream;

FIGS. 9A-F show plots of performance data associated with a bandpass filter having a pure/ideal 2-ohm load resistance for use with the LTE bitstream;

FIGS. 10A-F show plots of performance data for a bandpass filter having a double-terminated 2-ohm load for use with the LTE bitstream; and FIG. 11 is a table showing a comparison of input/output characteristics for the pure/ideal 2-ohm impedance bandpass filter, double-terminated bandpass filter, and constant-impedance bandpass filter for use with the Two-tone bitstream.

Figure 1:
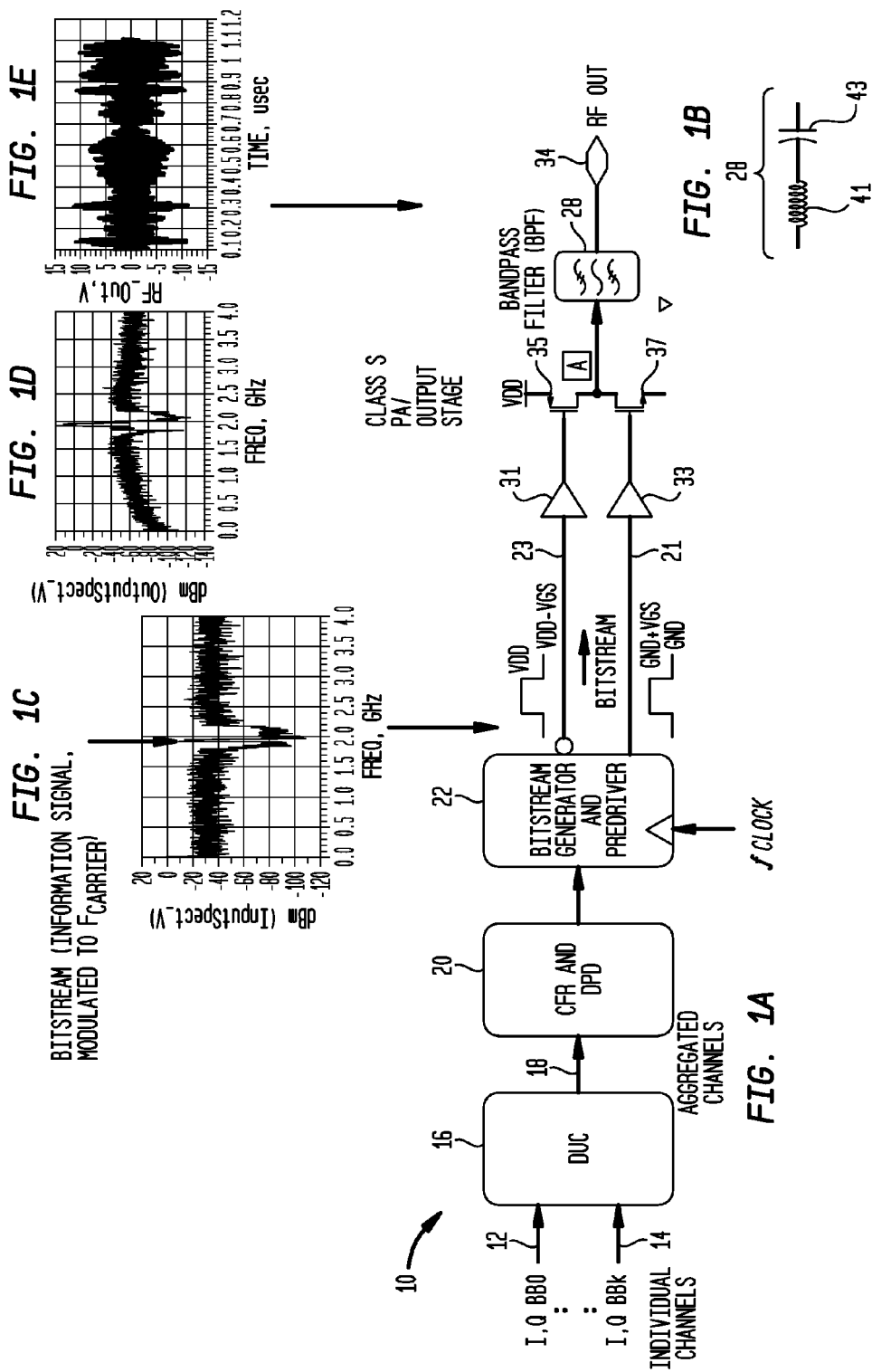
FIG. 1A is a block diagram of a Class S power amplifier transmit chain.
FIG. 1B is a schematic diagram of an output filter used in the Class S power amplifier transmit chain shown in FIG. 1A.
FIG. 1C is a plot of voltage versus time of a bitstream information signal before a power amplifier output stage shown in FIG. 1A.
FIG. 1D is a plot of power versus frequency of the bitstream information signal following the power amplifier output stage shown in FIG. 1A.
FIG. 1E is a plot of voltage versus time for the bitstream information signal following the power amplifier output stage shown in FIG. 1A.

It is to be appreciated that elements in the figures are illustrated for simplicity and clarity. Common but well-understood elements, which may be useful or necessary in a commercially feasible embodiment, are not necessarily shown in order to facilitate a less hindered view of the illustrated embodiments.

DETAILED DESCRIPTION

Embodiments of the invention will be described herein in the context of radio frequency (RF) amplifiers, amplifications systems, integrated circuits, and methods. It should be understood, however, that embodiments of the invention are not limited to these or any other particular embodiments. Rather, embodiments of the invention are more broadly applicable to amplifiers, amplification systems, integrated circuits, and methods to be used in any frequency range or ranges. In this regard, embodiments of the invention provide a substantial reduction in noise and distortion. Moreover, it will become apparent to those skilled in the art given the teachings herein that numerous modifications can be made to the illustrative embodiments shown that are within the scope of the claimed invention. That is, no limitations with respect to the embodiments shown and described herein are intended or should be inferred.

As a preliminary matter, for purposes of clarifying and describing embodiments of the invention, the following table provides a summary of certain acronyms and their corresponding definitions, as the terms are used herein:

Table of Acronym Definitions

| Acronym | Definition |
| --- | --- |
| RFPA | Radio frequency power amplifier |
| RF | Radio frequency |
| GHz | Gigahertz |
| IF | Intermediate frequency |
| CFR | Crest factor reduction |
| DPD | Digital predistortion |
| LTE | Long-term evolution |
| BPF | Bandpass filter |
| DUC | Digital up-converter |
| ZOH | Zero-order hold |
| SNR | Signal-to-noise ratio |
| SQNR | Signal-to-quantization noise ratio |
| dB | Decibels |
| SDR | Signal-to-distortion ratio |
| SNDR | Signal-to-noise distortion ratio |
| SFDR | Signal-to-frequency distortion ratio |
| LC | Inductive-capacitive or inductance-capacitance |
| CMOS | Complementary metal-oxide-semiconductor |

Class S RF power amplifiers (RFPAs) accept a digital pulse-density-modulated bitstream, which conveys the passband RF information to be transmitted. The bitstream encoding process suppresses quantization noise within a neighborhood approximately centered on an RF carrier frequency and pushes the noise outside a signal slot, which is the slot that includes the desired passband RF signal. A bandpass filter (BPF) following the active RFPA stage attenuates the outband noise, and enables only the passband RF signal to pass. Bandpass filter properties directly influence noise attenuation and distortion performance of the Class S RFPA.

Existing Class S RFPAs typically implement the bandpass filter as series resonant tank circuits in the case of voltage-mode configuration RFPAs, or as double-terminated filters. These bandpass filter topologies exhibit impedance only within the passband, and thus reflect outband noise back to the source, which results in a mechanism that worsens distortion in Class S RFPAs.

Class S radio frequency power amplifiers use single-bit sequences to synthesize radio frequency signals. As Class S technology moves the digital-to-analog boundary towards the power amplifier output stage, an increase in integration relative to analog radio frequency signal processing techniques is made possible.

Bitstream generators for use in Class S radio frequency transmitters upshift baseband information to a desired carrier frequency while shaping single-bit quantization noise power away from a carrier frequency $F_{CARRIER}$. To minimize zero-order hold (ZOH) losses in an output stage, which is essentially a single-bit power digital-to-analog converter (DAC), and to provide sufficient oversampling to support noise shaping, a clock frequency used by the bitstream generator is set to a value defined by the following equation:

$$F_{CLOCK} = 4 \times F_{CARRIER} \quad (1)$$

ZOH refers to a mathematical model of a practical signal reconstruction performed by a digital-to-analog converter; that is, it describes the effect of converting a discrete-time signal to a continuous-time signal by holding each sample value constant for one sample interval. Thus, ZOH loss is a loss in accuracy due to conversion of a continuous-time signal to a discrete-time signal, and is acceptably small at approximately 0.9 dB for an oversampling factor of four used in equation (1) above.

Embodiments disclosed herein are directed to a Class S RFPA or digital RF predriver having a constant-impedance bandpass filter at its output. This configuration improves signal-to-noise ratio (SNR) and signal-to-distortion ratio (SDR) of an RF signal to be delivered. The RFPA also offers the benefit of direct digital control of output power, for example using a power control digital bus for use in wireless applications, such as wireless protocols, signal processing, antennas, and the like. The following references are incorporated by reference herein in their entireties:

A. Wentzel, et al., "A Voltage-Mode Class-S Power Amplifier for the 450 MHz Band," *Int. J. Microwave and Wireless Techn.*, February 2011;

M. Berroth, et al., "A 1.6 GHz Switch Mode Power Amplifier with Continuous-Time Bandpass Delta-Sigma Modulator," *IEEE Int. Midwest Symp. Circ. Syst. MWSCAS*, August 2009;

E. Serebryakova, et al., "Miniaturisation of Combline Filters for Switched-Mode Power Amplifier Systems," *Adv. Radio Sci.*, No. 6, 2008; and E. Serebryakova, et al., "High-Power Filters for Switched-Mode Power Amplifier Systems," *IEEE Radio and Wireless Symp.*, January 2009.

In Class S amplifiers, the input baseband signal is transformed to a binary pulse sequence or bitstream by a modulator or bitstream generator, which is implementable, for example, as a sigma-delta modulator. The bitstream generator shapes single-bit quantization noise power, which positions noise power away from a signal of interest. The bitstream or pulse sequence is amplified by a switching amplifier output stage. A bandpass filter at the output of the switching amplifier is used to suppress outband-shaped noise and to pass the signal of interest and any residual noise within the band containing the signal of interest. An increase in efficiency relative to non-switching configurations, such as Class B configurations, is derived from the use of a pulse modulation scheme and operation of the Class S output stage in a pure switching mode.

Figure 2:
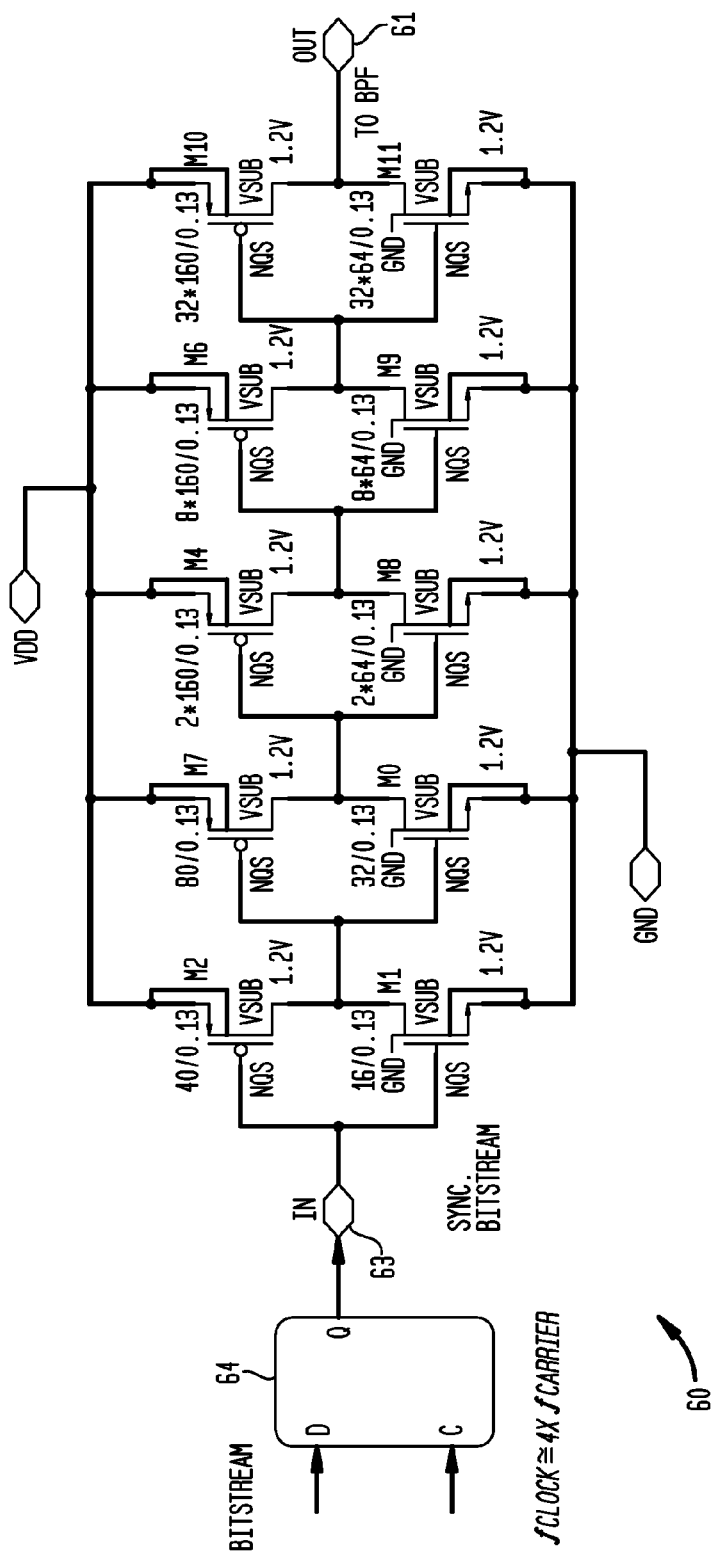
FIG. 2 is a schematic diagram of an embodiment of a complementary metal-oxide semiconductor (CMOS) implementation of the Class S voltage-mode power output stage driver shown in FIG. 2.

The voltage-mode configuration referred to herein and shown in FIG. 2 is an embodiment of a Class S power output stage. In the voltage-mode amplifier configuration, the switching stage produces a voltage output. An alternative Class S amplifier configuration is referred to herein as a current-mode configuration and includes an output stage that generates a current output. The terms "Class D" and "voltage-mode Class S" are often used interchangeably.

The term "Class S," when used in an RF context, refers broadly to the use of sigma-delta-like modulation to generate the bitstream. A series inductive-capacitive (LC) network used in existing voltage-mode Class S amplifiers creates a bandpass filter, which passes signals in a band of interest centered about the desired signal, while rejecting noise that is moved outside the band of interest by the modulation process.

FIG. 1A shows at least a portion of an exemplary Class S-based RFPA and associated signal processing subsystems 10 in which embodiments of the invention are implemented. A plurality of complex baseband information signals, 12 and 14, are received by a digital up-converter (DUC) 16, which aggregates the plurality of complex baseband signals 12, 14 into a composite signal 18 and assigns the plurality of complex baseband signals 12, 14 to adjacent frequency slots. Aggregation is achieved, in one or more embodiments, by multiplying each of 0 to k indexed complex baseband signals $(I_k + jQ_k)$ by a complex exponential $e^{j2\pi f_k t}$, wherein k is an integer and $f_k$–$f_{k-1}$ represents channel bandwidth. The results of the multiplications are summed to produce the composite signal 18 at an appropriate intermediate frequency (IF). The composite signal 18 is then applied to a crest factor reduction (CFR) and digital predistortion (DPD) block 20 to reduce dynamic range, improve RFPA efficiency, and remove non-linearities caused by the RFPA prior to application to a bitstream generator 22.

The CFR function 20 reduces signal dynamic range. For example, whereas a typical LTE signal may exhibit a peak-to-average power ratio of approximately 15 dB, after CFR, this value may be reduced with acceptable distortion to approximately 8 dB using threshold-cross detection and pulse-addition. DPD block 20 is operative to pre-distort the input signal to the power amplifier in order to counteract nonlinearities in the power output stage. DPD is customarily performed by demodulating the power amplifier output using a high-quality receiver, comparing the result with the desired transmit signal, and adaptively forming a predistortion/pre-shaping lookup table approximately inverse to the power amplifier nonlinearity. The DPD correction is incorporable into the bitstream generator.

Sigma-delta bitstream generators 22 are implementable in various ways, as will be appreciated by those skilled in the art. One classical method of implementing a sigma-delta bitstream generator involves closing a feedback loop around a single-bit quantizer (a signum operator). The feedback loop includes filters that shape the resulting quantization noise to obtain noise attenuation within a signal band of interest centered at the carrier frequency. Another approach relies on Viterbi techniques to find an optimal-in-least-squares-sense bitstream having desired quantization noise spectral properties. Aggregation enables a single transmit chain to serve multiple baseband channels and is an intrinsic part of wireless standards such as LTE.

The bitstream generator 22 shown in FIG. 1A, implementation choices for which include a bandpass sigma-delta convertor, Viterbi-based optimal-pulse-sequence unit, or pulse width modulator, upshifts the signal received from the CFR DPD 20 to a desired carrier frequency, $F_{CARRIER}$, encodes the binary bitstream containing the upconverted aggregated band, and shapes quantization noise power outside the information band. The noise is shaped away from the carrier frequency so that a bandpass filter passing the carrier and its associated signal band can exclude the noise. For N bits of quantization (where N is an integer; in this case, N is equal to 1 and the signal is assumed to be uniformly distributed), the signal-to-quantization noise ratio (SQNR) is provided by SQNR=6.02*N decibels (dB). Thus, the quantization noise frequency spectrum must be redistributed to reduce noise power within the signal passband.

The bitstream generator 22 is driven by a system clock signal, $f_{CLOCK}$, and provides a modulated bitstream to a predriver. In one or more embodiments, to reduce ZOH losses in the Class S output stage 32, the bandpass bitstream generator is clocked at a frequency which is about four times the carrier frequency $F_{CARRIER}$.

The predrivers 31 and 33 receive low-level digital bitstreams 21, 23 from the bitstream generator, and buffer and amplify the low-level digital bitstreams 21, 23 to a level sufficient to drive the gates of the output transistors in output stage 35, 37. Low impedance drive is used to increase device switching speed in the presence of gate capacitance. In the illustrated voltage-mode topology, a pair of output devices 35 and 37 operate in a switch-mode regime to switch the input of the bandpass filter 28 between nominally GND and VDD potentials in sympathy (i.e., in synchronization) with the driving bitstream signals 21, 23. The output devices are of complementary polarity, or of common polarity, in which case a floating gate driver is required on the upper transistor 35. Current-mode topology is also configurable, wherein a pair of same-polarity, preferably N-type, devices alternately route a constant current to GND, or through the bandpass filter, which, in this case, in known implementations, would include a parallel-resonant tank circuit. The output of the Class S power amplifier output stage 35, 37 is applied to a bandpass filter 28 to recover the modulated RF signal and eliminate out-of-band quantization noise. The output stage 35, 37 converts differential output voltage provided by the bandpass filter 28 into a single-ended format RF output signal 34 for application to an antenna or transmit/receive duplexer. The typically used bandpass filter 28 is shown in more detail in FIG. 1B, and includes a serially-coupled inductor 41 and capacitor 43, improvements regarding which are incorporated in embodiments disclosed herein. FIG. 1C shows a plot of voltage versus time of a bitstream information signal before the Class S power amplifier output stage 35, 37. FIG. 1D shows a plot of power versus frequency of the bitstream information signal following the Class S power amplifier output stage 35, 37. FIG. 1E shows a plot of voltage versus time for the bitstream information signal following the Class S power amplifier output stage 35, 37.

The power amplifier output stage 35, 37 is switched at a rate in excess of eight billion transmissions per second in 2.14 GHz cellular band applications. However, high-power GaN (gallium nitride) RF transistors have difficulty switching at this rate. Thus, the embodiments disclosed herein utilize Class S output stage configurations, which have an ability to use small-geometry fast-switching devices in combination to achieve greater power output than that provided by a single stage using larger and/or slower transistors. A further benefit realized by one or more embodiments of the invention is direct digital control of the output power. Output power modulation enables a significant reduction in consumed power for applications in which full output power capability is unnecessary. The properties of the bandpass filter 28 play a key role in the embodiments disclosed herein. The illustrative configuration 10 shown in FIG. 1A is used as a primary RFPA, in which case the RF output 34 of the bandpass filter 28 is applied to a duplexer and then to an antenna; or as a predriver, in which the RF output 34 drives a high power RFPA.

FIG. 2 shows an exemplary embodiment 60 of a CMOS voltage-mode implementation of the illustrative power amplifier output stage 35, 37 shown in FIG. 1A, according to an embodiment of the invention. The embodiment 60 includes digital telescoping inverter chains, in which stage strengths are progressively increased towards an output terminal 61. While five stages are shown in this embodiment 60, it is to be appreciated that embodiments of the invention are not limited to any specific number of stages. Amplifier stages in the embodiment 60 have low-impedance voltage-mode outputs with typical strength-increase factors of about two to four times, although embodiments of the invention are limited to a specific strength-increase factor. Embodiment 60, for example, utilizes 130 nm CMOS with VDD equal to 1.2 V. A bitstream swinging between VDD (1.2V) and VSS (0V or GND) is applied to an input terminal 63, following which the bitstream is progressively powered-up and buffered until the bitstream reaches the output terminal 61. At the output terminal 61, the swing remains equal to VDD−VSS=1.2V, but is available at a very low impedance, which is in the order of less than about one ohm in this embodiment. Alternative topologies are selectable for the channels, such as embodiments providing both voltage gain and low output impedance. Although implemented using CMOS devices, other technologies, such as GaN, are equally applicable to the embodiments disclosed herein. The output 61 of the embodiment 60 may be applied directly to an antenna, or may be presented to an RFPA for further amplification following passage through a bandpass filter, which is constructed according to embodiments disclosed herein. The embodiment 60 also includes a D-type flip flop 64 that synchronizes bitstream edges to the reference low phase-noise clock signal $f_{CLOCK}$.

The bandpass filter impedance level required to achieve maximum power transfer into a 50-ohm load impedance from the amplification stages shown in FIG. 2 is significantly less than 50 ohms ($\Omega$), and thus subsequent up-matching is performed. An advantage of a low filter reference impedance is reduced sensitivity to printed circuit board etch tolerances in realizations utilizing printed or microstrip filters. Consistent with the voltage-mode drive, the input of the bandpass filter 28 in conventional implementations is of a series resonant-type in order to pass a desired signal centered at $F_{CARRIER}$ while presenting an open-circuit to quantization noise and high signal harmonics outside the band of interest.

Relative to operation into an ideal resistive load, simulations indicate that the signal-to-noise distortion ratio (SNDR) associated with Class S output drivers is degraded by approximately 20 dB when the driver is operated into a conventional bandpass filter. This is caused by reflection of outband noise power back to the driver. In the embodiments disclosed herein, the bandpass filter is synthesized using a constant input impedance, an up-match of impedance from the output stage, and SNDR is determined relative to that attained with ideal resistive and reflective bandpass filter loads, which are the essence of the disclosed embodiments. Up-matching employs a lossless network to perform an impedance transformation between the optimal load impedance of the output stage (terminal 61 in FIG. 2) and the working impedance of the BPF. Application of these concepts is illustrated herein in reference to a Long Term Evolution RF signal having a carrier frequency of 2.14 GHz. The bitstream sample frequency is 7.86432 GHz.

Figure 3:
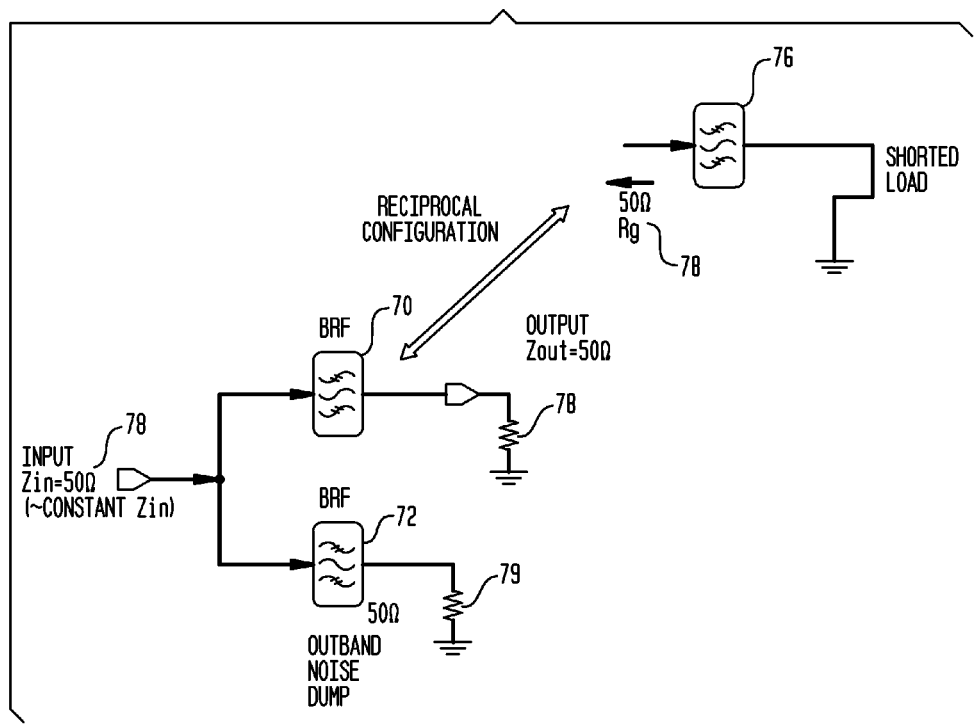
FIG. 3 is a block diagram showing a design model used to synthesize a bandpass filter.
Figure 4A:
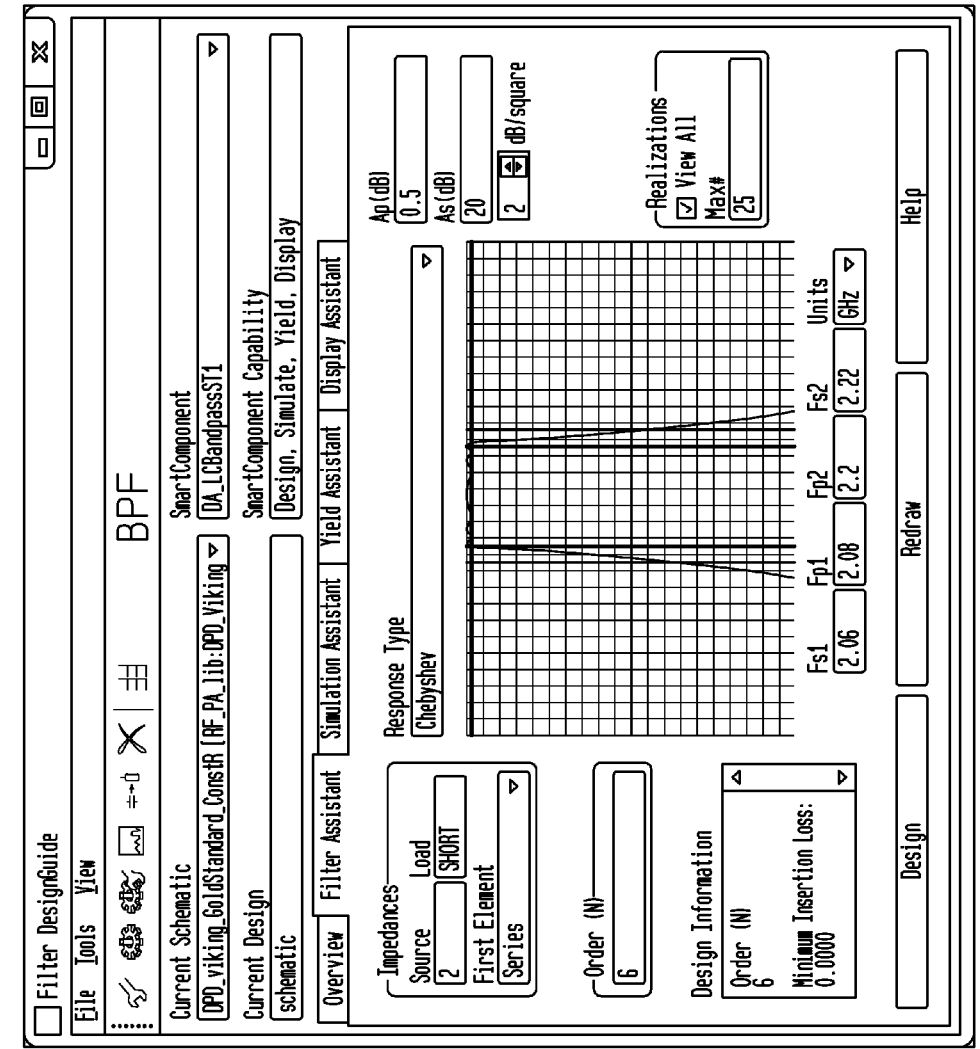
FIGS. 4A-B show simulation performance data for a constant-impedance bandpass filter for use with an LTE bitstream.
Figure 4B:
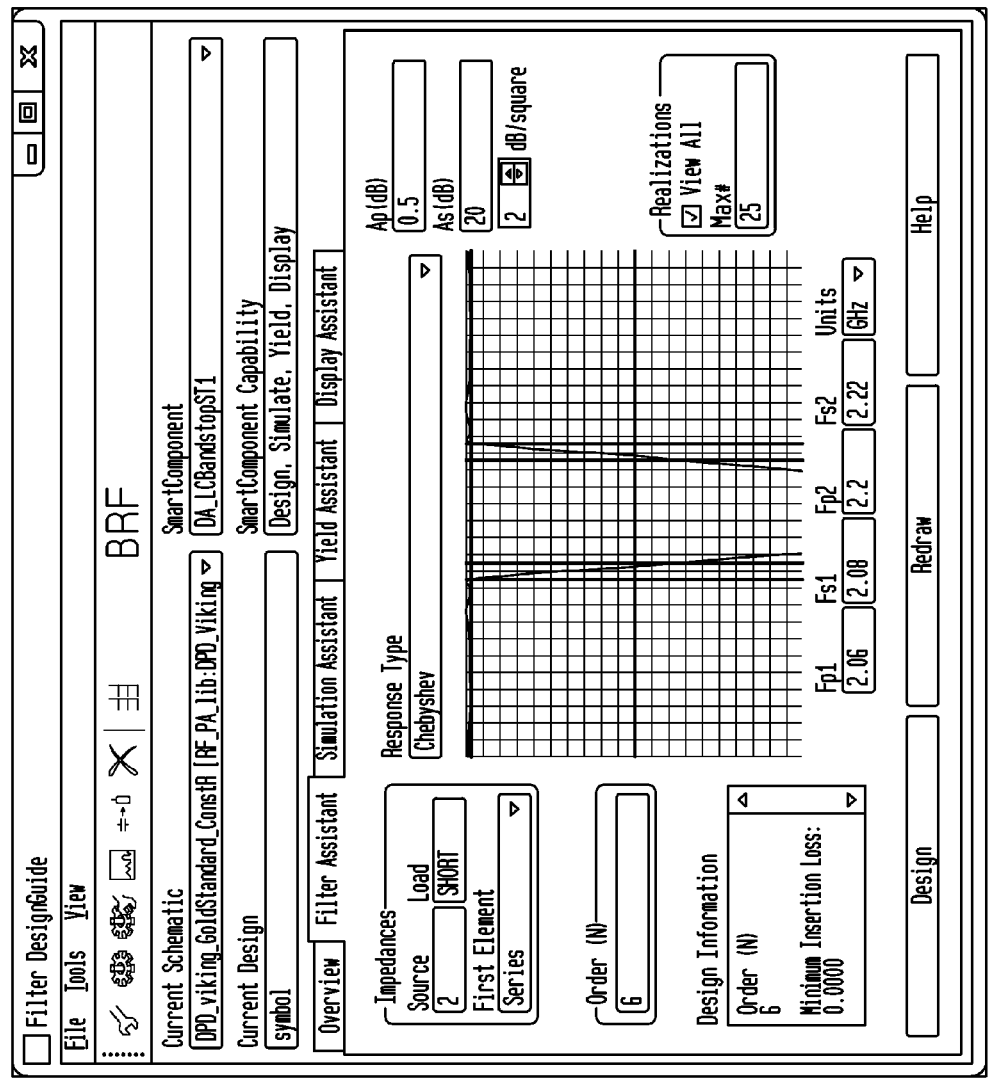
Figure 4C:
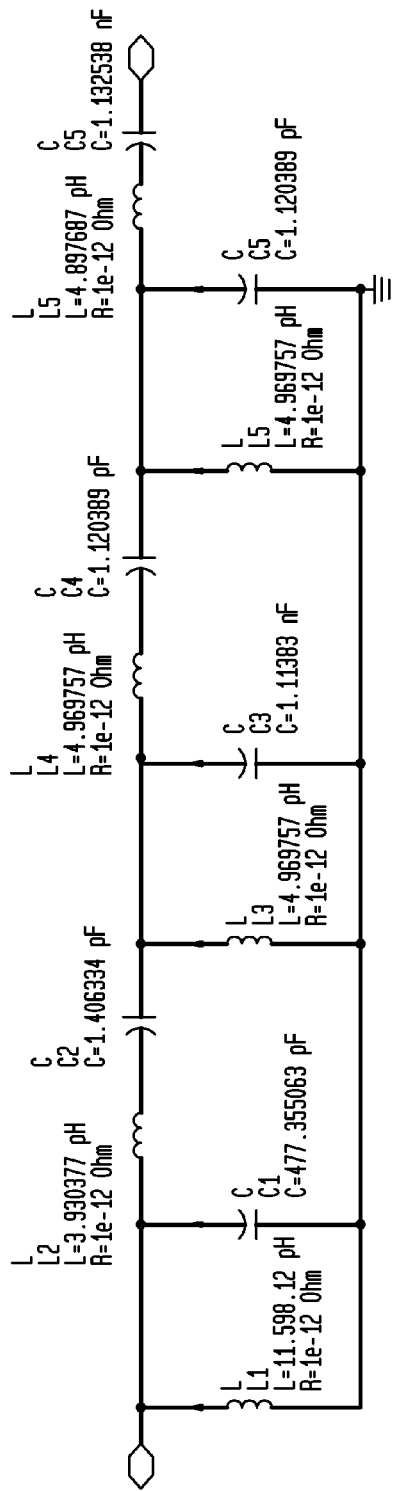
FIGS. 4C-D show simulation schematics used in synthesizing the constant-impedance bandpass filter for use with the LTE bitstream.
Figure 4D:
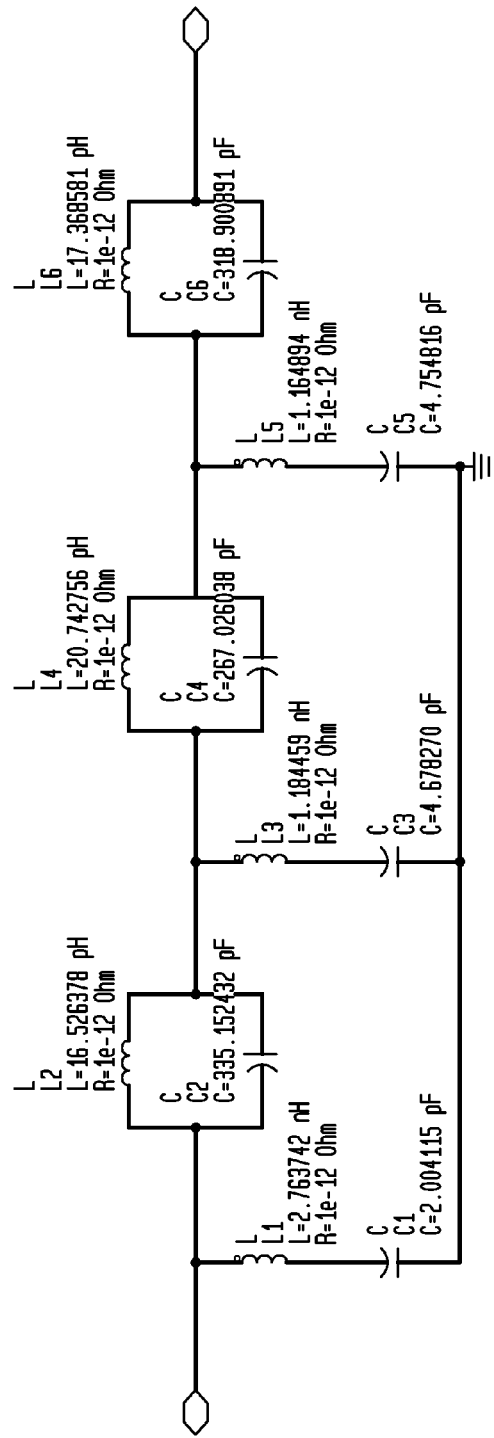

As shown in FIG. 3, the constant (real) impedance input filter used in embodiments disclosed herein includes complementary filters 70 and 72. An elliptic response is used in connection with embodiments herein to achieve steeper roll off. Each of the complementary filters 70 and 72 is synthesized as a singly-terminated filter 76. Lumped LC realizations are also used with one or more embodiments herein; however, distributed implementation is an alternative realization. Although 50$\Omega$ impedances 78, 79 are shown, other values are applicable as alternatives. In operation, signal power is passed through sub filter 70 to the output load 78, which may be an antenna or duplexer. Outband noise passes through sub filter 72 and then into a dummy load 79, in which the noise power is dissipated as heat.

Figure 5A:
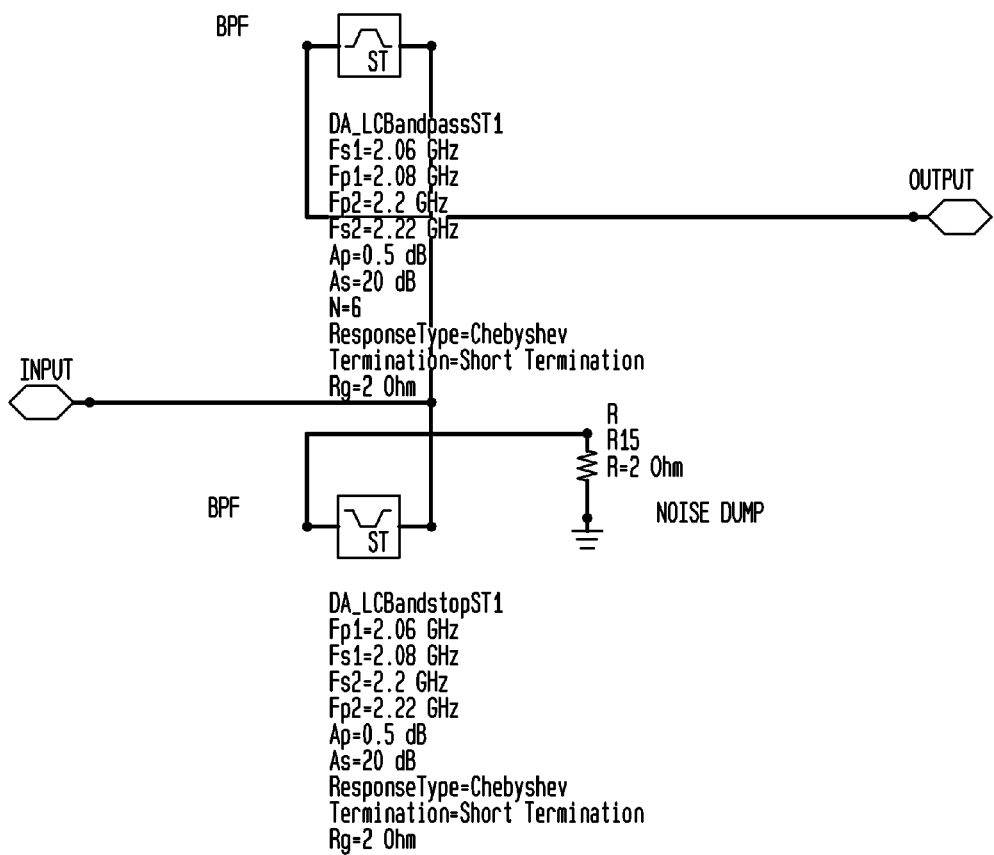
FIGS. 5A-B show simulation schematics used in synthesizing the constant-impedance bandpass filter for use with the LTE bitstream.
Figure 5B:
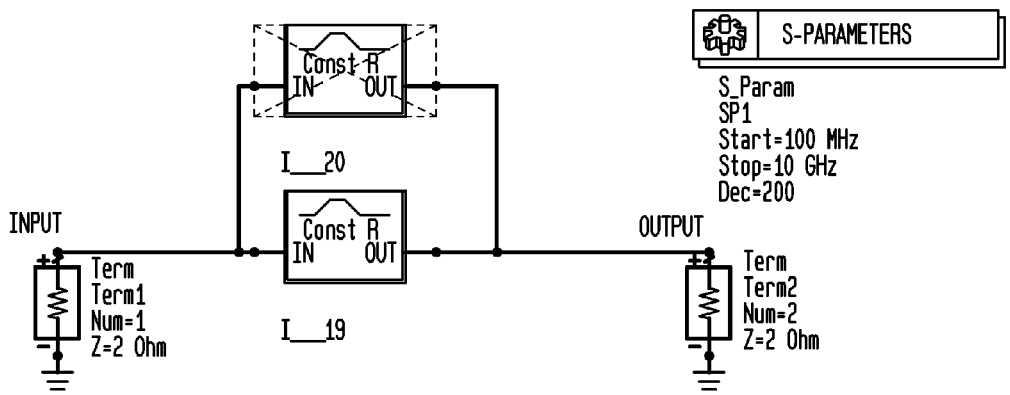
Figure 6B:
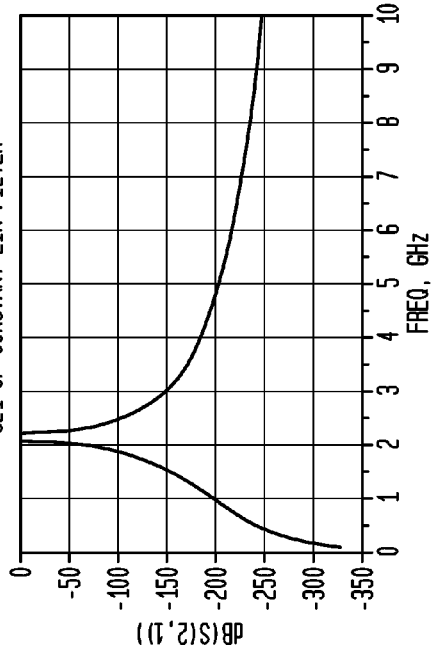
FIGS. 6A-C show plots of simulation performance data used in synthesizing the constant-impedance bandpass filter for use with the LTE bitstream.
Figure 6C:
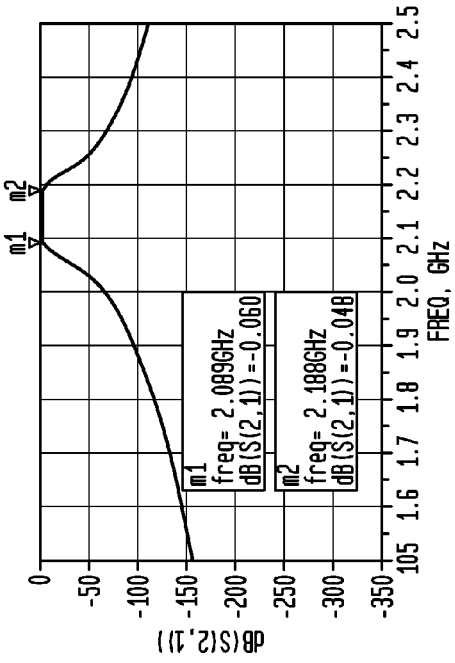
Figure 6A:
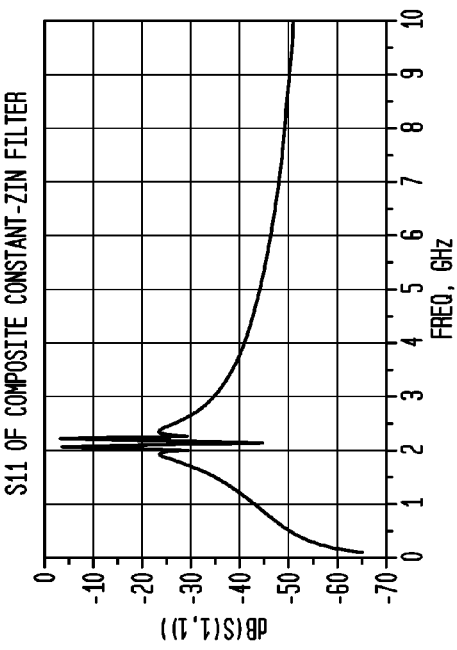

FIGS. 4 through 6 are directed to synthesis of an exemplary constant-impedance bandpass filter suitable for use with bitstream encoding an LTE signal according to embodiments disclosed herein. Specifically, FIG. 4A shows a frequency response of the signal-path sub-filter 70 shown in FIG. 3, and FIG. 4B shows a frequency response of the noise-path sub-filter 72 shown in FIG. 3. FIG. 4C shows a lumped implementation of the signal-path sub-filter 70 shown in FIG. 3, and FIG. 4D shows a lumped implementation of the noise-path sub filter 72 shown in FIG. 3. An input impedance of 2 ohms is chosen to achieve desired power transfer characteristics from the driver stage, which in this example is a CMOS implementation illustrated in FIG. 2. The passband is approximately 100 MHz. FIGS. 5A and 5B show simulation schematics for synthesis of the bandpass filter for the LTE bitstream set. FIGS. 6A through 6C show exemplary filter response curves of the constant-impedance bandpass filter for the LTE bitstream set. As indicated above, the filter impedance level here has been chosen as 2 Ohms to achieve maximum power transfer from the driving stage. Other drivers possess different maximum load values. After the filter, an up-matching network can be employed to match the filter to the conventional 50 Ohm RF environment. Alternatively, an up-match could be performed at the driver's output, and the filter synthesized at a 50 Ohm level.

Figure 7B:
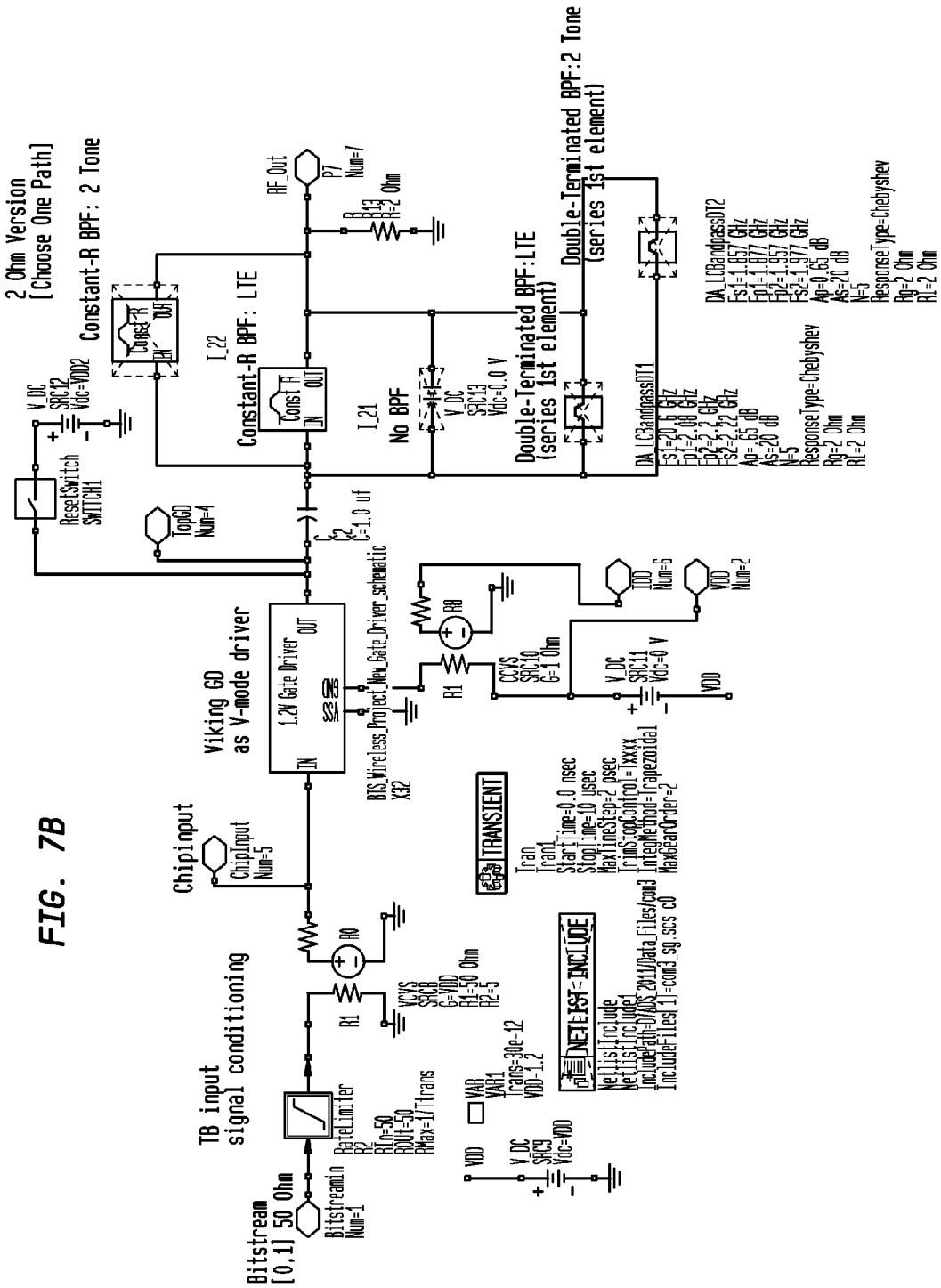
Figure 8A:
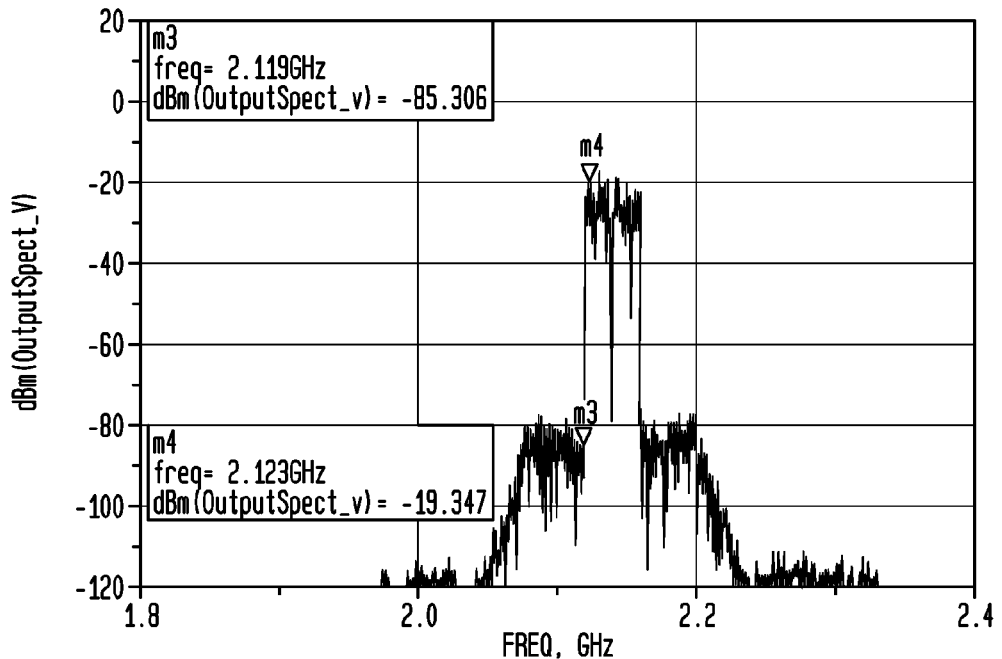
Figure 8B:
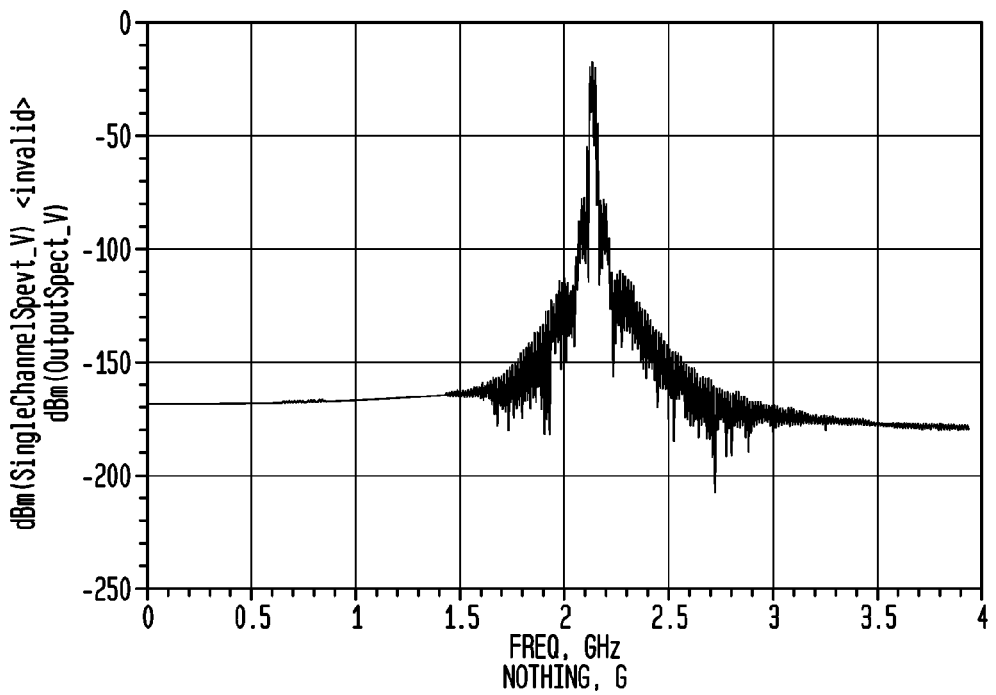
Figure 9A:
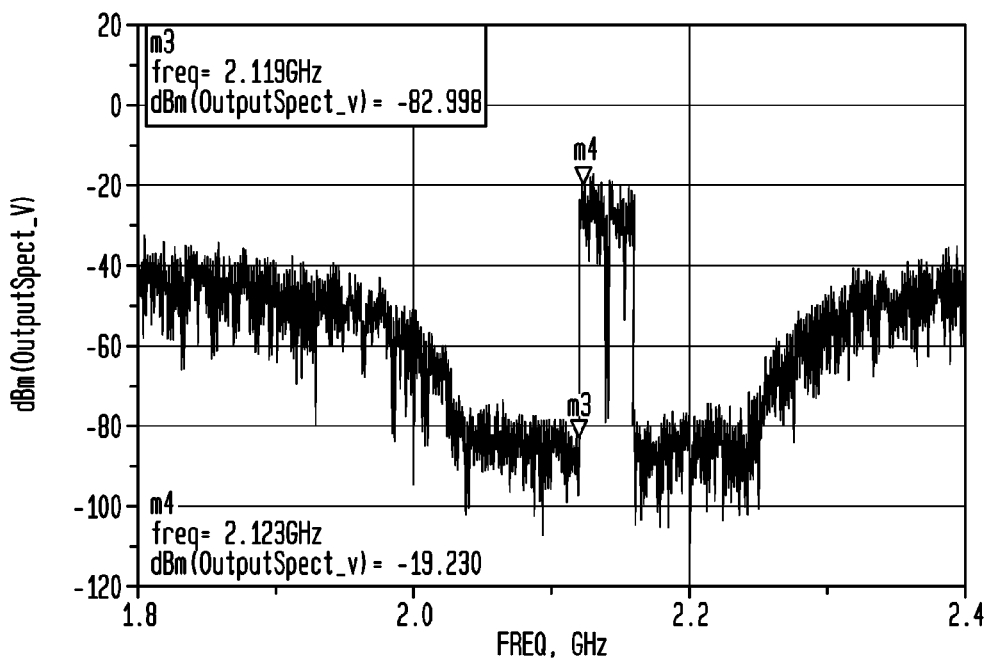
Figure 9B:
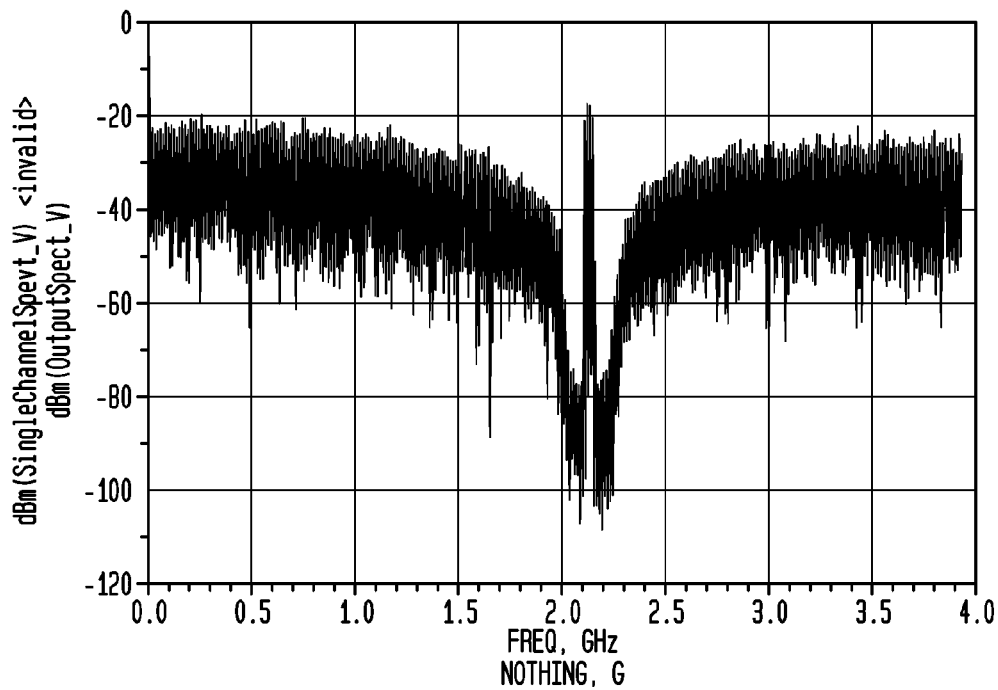

FIGS. 7A and 7B show exemplary bench test results for synthesis of the bandpass filter for bitstream encoding an LTE signal. FIGS. 8A through 8F show exemplary filter response curves of the bandpass filter with a constant impedance (e.g., about 2$\Omega$) for the LTE bitstream set. FIGS. 9A through 9F show exemplary filter response curves for a pure/ideal (2$\Omega$) resistance without the bandpass filter for the LTE bitstream set. FIGS. 10A through 10E show exemplary filter response curves of a conventional double-terminated bandpass filter loaded with a constant (2$\Omega$) impedance for the LTE bitstream set. In this case, outband noise is reflected back into the RFPA leading to reduced SNDR.

Figure 10A:
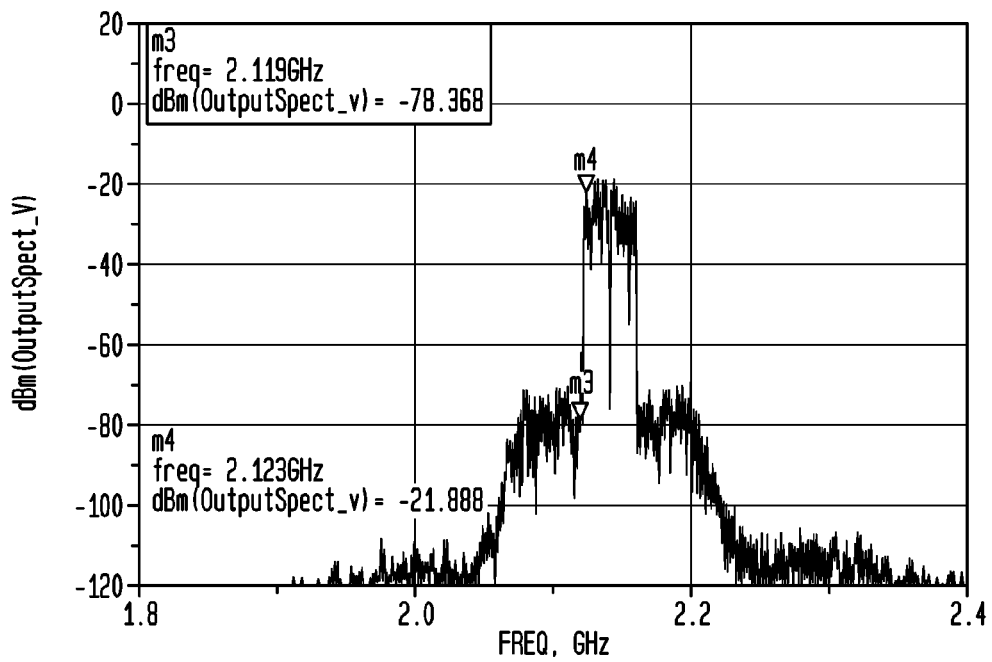
Figure 10B:
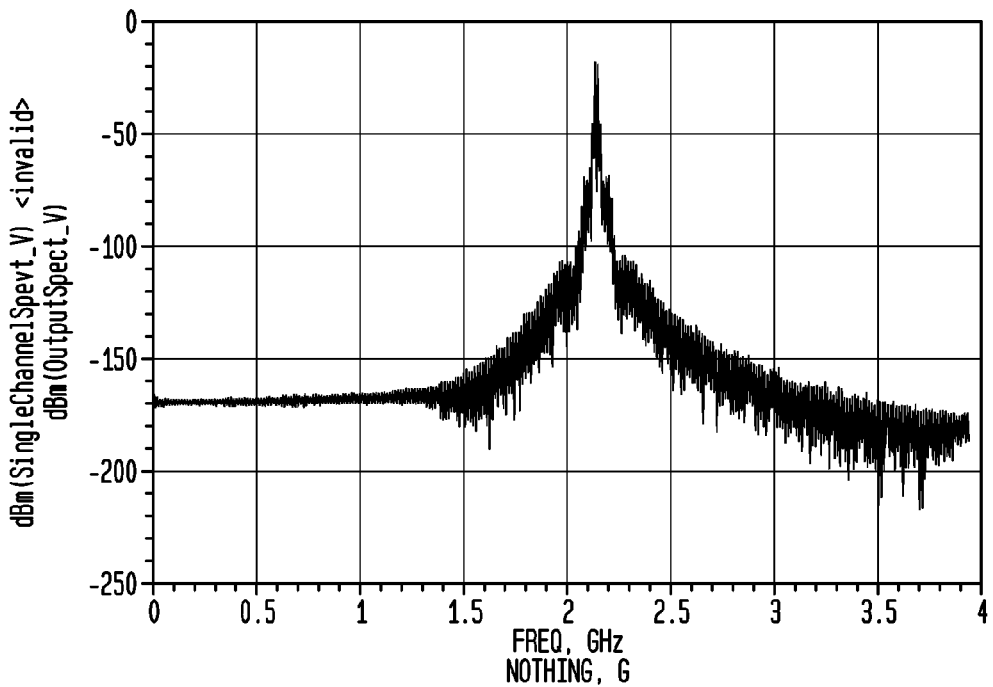
Figure 10C:
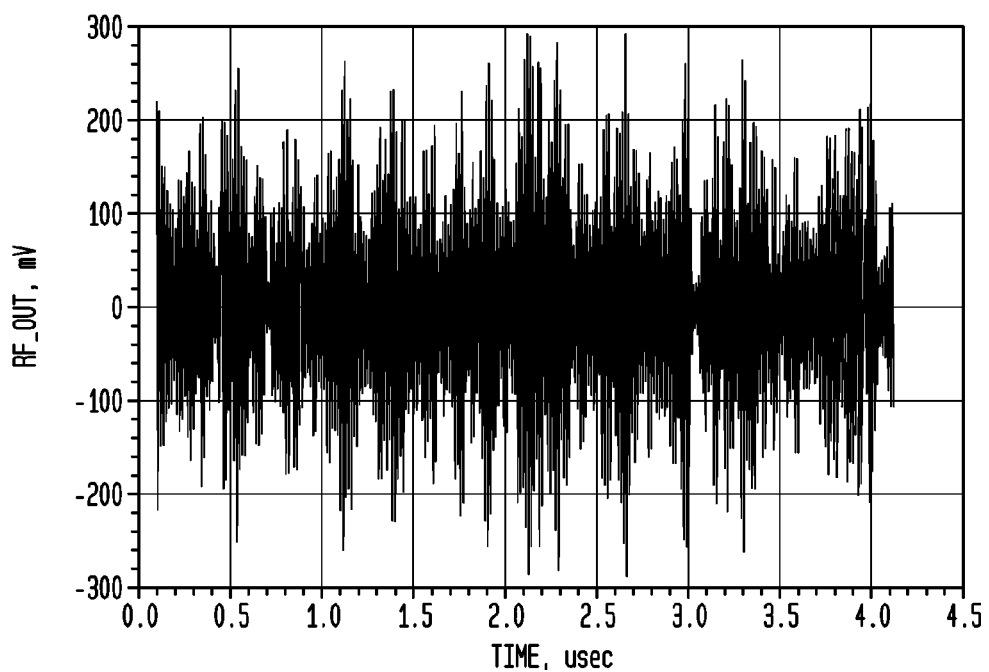

FIGS. 8D, 8E, 9D, 9E, 13D, and 13E illustrate the spectrum inherent in the driving bitstream. FIG. 9A is a magnified view of the driver output spectrum, when the driver is terminated in a 2-ohm load. An approximately 20 dB rise in signal-to-outband adjacent noise floor is exhibited relative to the ratio in the bitstream spectrum, which is approximately 60 dB. Application of DPD can reduce this impairment. FIG. 10A depicts the spectrum at the output of a conventional non-constant-impedance bandpass filter. Here, signal-to-adjacent channel noise floor ratio has degraded to approximately 40 dB.

FIG. 11 shows corresponding exemplary results using the constant-impedance filter according to one or more embodiments of the invention. In accordance therewith, the signal-to-outband noise ratio is approximately 60 dB, which represents an approximately 20 dB improvement relative to the illustrative results shown in FIG. 10A. This indicates that the constant input impedance bandpass filter used in the embodiments disclosed herein provides a substantial improvement in both output SFDR and output SNDR when compared with a conventional double-terminated bandpass filter or an ideal resistance. Also, the output SFDR and SNDR are approximately the same for the constant-impedance bandpass filter and ideal resistance cases.

Accordingly, the embodiments disclosed herein utilize Class S-based amplifiers with a constant-impedance bandpass filter to achieve lower distortion. While RF power amplifiers have been described in various embodiments, these embodiments are not limited to the specific arrangements shown and described herein. For example, any suitable form of power amplifier is contemplated to be within the scope of disclosed embodiments, including, but not limited to, voltage- and/or current-mode configuration Class S amplifiers.

At least a portion of the disclosed embodiments may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, and then packaged as an integrated circuit. One skilled in the art would know how to dice wafers and package die to produce integrated circuits. Any of the exemplary embodiments disclosed herein, or portions thereof, may be part of an integrated circuit. Integrated circuits so manufactured are considered within the scope of the disclosed embodiments.

An integrated and/or hybrid circuit in accordance with the disclosed embodiments is capable of being utilized in essentially any application and/or electronic system in which power amplifiers are utilized. Systems incorporating such integrated circuits are considered part of the disclosed embodiments. Given the teachings provided herein, one of ordinary skill in the art would be able to contemplate other implementations and applications.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. An amplification system, comprising:
a bandpass filter operative to filter at least one of an input digital bitstream and an amplified signal and to generate a filtered signal, the bandpass filter being configured to provide constant input impedance over a passband associated with the input signal, the bandpass filter being configured to provide constant input impedance over a stopband associated with shaped-noise energy, thereby increasing at least one of signal-to-noise ratio and signal-to-distortion ratio associated with the filtered signal; and
an amplifier coupled with the bandpass filter, the amplifier amplifying at least one of the filtered signal and the input digital bitstream to provide the amplified signal;
wherein the input digital bitstream comprises at least one of a Long Term Evolution (LTE) bitstream set and a Two-tone bitstream set.

2. The amplification system defined by claim 1, wherein the amplifier comprises a Class S power amplifier.

3. The amplification system defined by claim 1, wherein the bandpass filter is singly-terminated.

4. The amplification system defined by claim 1, wherein the bandpass filter comprises complementary filters.

5. The amplification system defined by claim 4, wherein at least one of the complementary filters is associated with at least one of the LTE bitstream set and the Two-tone bitstream set.

6. The amplification system defined by claim 1, wherein the amplifier matches output impedance associated with the amplifier to the constant input impedance associated with the bandpass filter.

7. An integrated circuit, comprising:
a bandpass filter, the bandpass filter filtering at least one of an input digital bitstream and an amplified signal to provide a filtered signal, the bandpass filter comprising constant input impedance over a passband associated with the input digital bitstream, the bandpass filter comprising constant input impedance over a stopband associated with shaped-noise energy, thereby increasing at least one of signal-to-noise ratio and signal-to-distortion ratio associated with the filtered signal; and
an amplifier, the amplifier amplifying at least one of the filtered signal and the input digital bitstream to provide the amplified signal;
wherein the input digital bitstream comprises at least one of a Long Term Evolution (LTE) bitstream set and a Two-tone bitstream set.

8. The integrated circuit defined by claim 7, wherein the amplifier comprises a Class S power amplifier.

9. The integrated circuit defined by claim 7, wherein the bandpass filter is singly-terminated.

10. The integrated circuit defined by claim 7, wherein the bandpass filter comprises complementary filters.

11. The integrated circuit defined by claim 10, wherein at least one of the complementary filters is associated with at least one of the LTE bitstream set and the Two-tone bitstream set.

12. The integrated circuit defined by claim 7, wherein the amplifier matches output impedance associated with the amplifier to the constant input impedance associated with the bandpass filter.

13. A method of amplifying a signal, the method comprising:
bandpass filtering at least one of an input digital bitstream and an amplified signal to generate a filtered signal;

providing constant input impedance over a passband and a stopband by the bandpass filtering, the passband being associated with the input digital bitstream, the stopband being associated with shaped-noise energy, thereby increasing at least one of signal-to-noise ratio and signal-to-distortion ratio associated with the filtered signal; and amplifying at least one of the filtered signal and the input digital bitstream to generate the amplified signal;

wherein the input digital bitstream comprises at least one of a Long Term Evolution (LTE) bitstream set and a Two-tone bitstream set.

14. The method of providing amplification defined by claim 13, further comprising providing single terminations associated with the bandpass filtering.

15. The method of providing amplification defined by claim 13, further comprising providing complementary filters associated with the bandpass filtering.

16. The method of providing amplification defined by claim 15, further comprising configuring at least one of the complementary filters to be associated with at least one of the LTE bitstream set and the Two-tone bitstream set.

17. The method of providing amplification defined by claim 13, further comprising matching output impedance associated with the amplifier to the constant input impedance associated with the bandpass filter.

* * * * *